United States Patent
Walsh et al.

(10) Patent No.: US 7,782,612 B2
(45) Date of Patent: *Aug. 24, 2010

(54) NOISEPROOFED AND VENTILATED AIR INTAKE CHAMBER FOR ELECTRONICS EQUIPMENT ENCLOSURE

(75) Inventors: Tim Walsh, Marlow (GB); David O'Coimin, Bristol (GB)

(73) Assignee: Kell Systems, Marlow Bucks (GB)

( * ) Notice: Subject to any disclaimer, the term of this patent is extended or adjusted under 35 U.S.C. 154(b) by 0 days.

This patent is subject to a terminal disclaimer.

(21) Appl. No.: 12/041,152

(22) Filed: Mar. 3, 2008

(65) Prior Publication Data

US 2008/0144280 A1 Jun. 19, 2008

Related U.S. Application Data

(63) Continuation of application No. 11/678,252, filed on Feb. 23, 2007, now Pat. No. 7,379,298, which is a continuation-in-part of application No. 11/489,785, filed on Jul. 20, 2006, now Pat. No. 7,379,299.

(60) Provisional application No. 60/783,233, filed on Mar. 17, 2006.

(51) Int. Cl.
   *H05K 7/20* (2006.01)
(52) U.S. Cl. ............... 361/690; 361/688; 361/692; 361/694; 181/210; 165/104.33; 454/184
(58) Field of Classification Search ............... 361/692, 361/694, 688, 690, 695, 696; 181/198, 200, 181/225; 454/184, 906
See application file for complete search history.

(56) References Cited

U.S. PATENT DOCUMENTS 4,035,711 A * 7/1977 Piller ................ 363/174

| 4,600,326 | A | | 7/1986 | Fudatsuji et al. |
| 4,665,466 | A | | 5/1987 | Green |
| 4,702,145 | A | | 10/1987 | Kannapell et al. |
| 4,797,783 | A | | 1/1989 | Kohmoto et al. |
| 5,040,095 | A | | 8/1991 | Beaty et al. |
| 5,216,579 | A | | 6/1993 | Basara et al. |
| 5,332,872 | A | * | 7/1994 | Ewanek .............. 181/224 |
| 5,424,916 | A | * | 6/1995 | Martin .............. 361/698 |
| 5,440,450 | A | | 8/1995 | Lau et al. |
| 5,452,362 | A | * | 9/1995 | Burward-Hoy ........ 381/71.5 |

(Continued)

OTHER PUBLICATIONS

Kell Systems website pages as retrieved Aug. 2004 from http://www.kellsystems.co.uk/html/homepage.htm.

*Primary Examiner*—Jayprakash N Gandhi
*Assistant Examiner*—Courtney Smith
(74) *Attorney, Agent, or Firm*—Wilmer Cutler Pickering Hale and Dorr LLP

(57) ABSTRACT

A system and method are disclosed for enclosing electronic equipment in a noiseproofed and ventilated enclosure. This includes supplying air to an enclosure and removing air from the enclosure through acoustic chambers attached to the enclosure. The acoustic chambers can be constructed of materials or be treated with materials that have noise-absorbing or noise-abating properties. In addition, the acoustic chamber for exhausting air from the enclosure can contain baffles that help to prevent noise that has entered the acoustic chamber from leaving the chamber. And, the system and method can use a cable egress port that allows cables and wiring to pass through the egress port while blocking the transmission of noise through the egress port.

18 Claims, 7 Drawing Sheets

U.S. PATENT DOCUMENTS

| | | | | |
|---|---|---|---|---|
| 5,526,228 A | * | 6/1996 | Dickson et al. | 361/695 |
| 5,544,012 A | | 8/1996 | Koike et al. | |
| 5,894,407 A | | 4/1999 | Aakalu et al. | |
| 5,917,698 A | | 6/1999 | Viallet et al. | |
| 5,949,646 A | | 9/1999 | Lee et al. | |
| 5,978,217 A | | 11/1999 | Kerrigan et al. | |
| 6,082,441 A | | 7/2000 | Boehmer et al. | |
| 6,086,476 A | * | 7/2000 | Paquin et al. | 454/184 |
| 6,088,225 A | | 7/2000 | Parry et al. | |
| 6,104,003 A | | 8/2000 | Jones | |
| 6,104,608 A | * | 8/2000 | Casinelli et al. | 361/692 |
| 6,151,210 A | | 11/2000 | Cercioglu et al. | |
| 6,186,890 B1 | | 2/2001 | French et al. | |
| 6,198,627 B1 | * | 3/2001 | Roehling et al. | 361/688 |
| 6,315,656 B1 | * | 11/2001 | Pawlowski | 454/184 |
| 6,381,134 B2 | | 4/2002 | Iwasaki et al. | |
| 6,459,578 B1 | * | 10/2002 | Wagner | 361/694 |
| 6,459,579 B1 | | 10/2002 | Farmer et al. | |
| 6,481,527 B1 | | 11/2002 | French et al. | |
| 6,544,309 B1 | | 4/2003 | Hoefer et al. | |
| 6,592,448 B1 | | 7/2003 | Williams | |
| 6,594,148 B1 | | 7/2003 | Nguyen et al. | |
| 6,618,248 B1 | | 9/2003 | Dalheimer | |
| 6,643,130 B1 | * | 11/2003 | DeMarchis et al. | 361/695 |
| 6,702,661 B1 | | 3/2004 | Clifton et al. | |
| 6,704,196 B1 | | 3/2004 | Rodriguez et al. | |
| 6,742,583 B2 | | 6/2004 | Tikka et al. | |
| 6,745,149 B2 | | 6/2004 | Beeten | |
| 6,816,372 B2 | * | 11/2004 | Huettner et al. | 361/695 |
| 6,889,752 B2 | | 5/2005 | Stoller | |
| 6,927,977 B2 | | 8/2005 | Singer | |
| 6,951,513 B1 | | 10/2005 | Greenslade et al. | |
| 6,987,673 B1 | | 1/2006 | French et al. | |
| 7,027,301 B2 | | 4/2006 | Merlet et al. | |
| 7,074,123 B2 | | 7/2006 | Bettridge et al. | |
| 7,238,104 B1 | * | 7/2007 | Greenslade et al. | 454/184 |
| 7,312,991 B2 | * | 12/2007 | Lee et al. | 361/695 |
| 7,314,113 B2 | * | 1/2008 | Doll | 181/225 |
| 2003/0158695 A1 | * | 8/2003 | Beeten | 702/132 |
| 2005/0161280 A1 | | 7/2005 | Furuya | |
| 2006/0002084 A1 | | 1/2006 | Wei | |
| 2006/0054380 A1 | | 3/2006 | Doll | |
| 2006/0104027 A1 | * | 5/2006 | Vinson et al. | 361/695 |
| 2006/0120045 A1 | | 6/2006 | Van Der Werff | |
| 2006/0148398 A1 | | 7/2006 | Ruch et al. | |
| 2007/0139882 A1 | * | 6/2007 | Bartell et al. | 361/695 |
| 2007/0218826 A1 | * | 9/2007 | Walsh et al. | 454/184 |

* cited by examiner

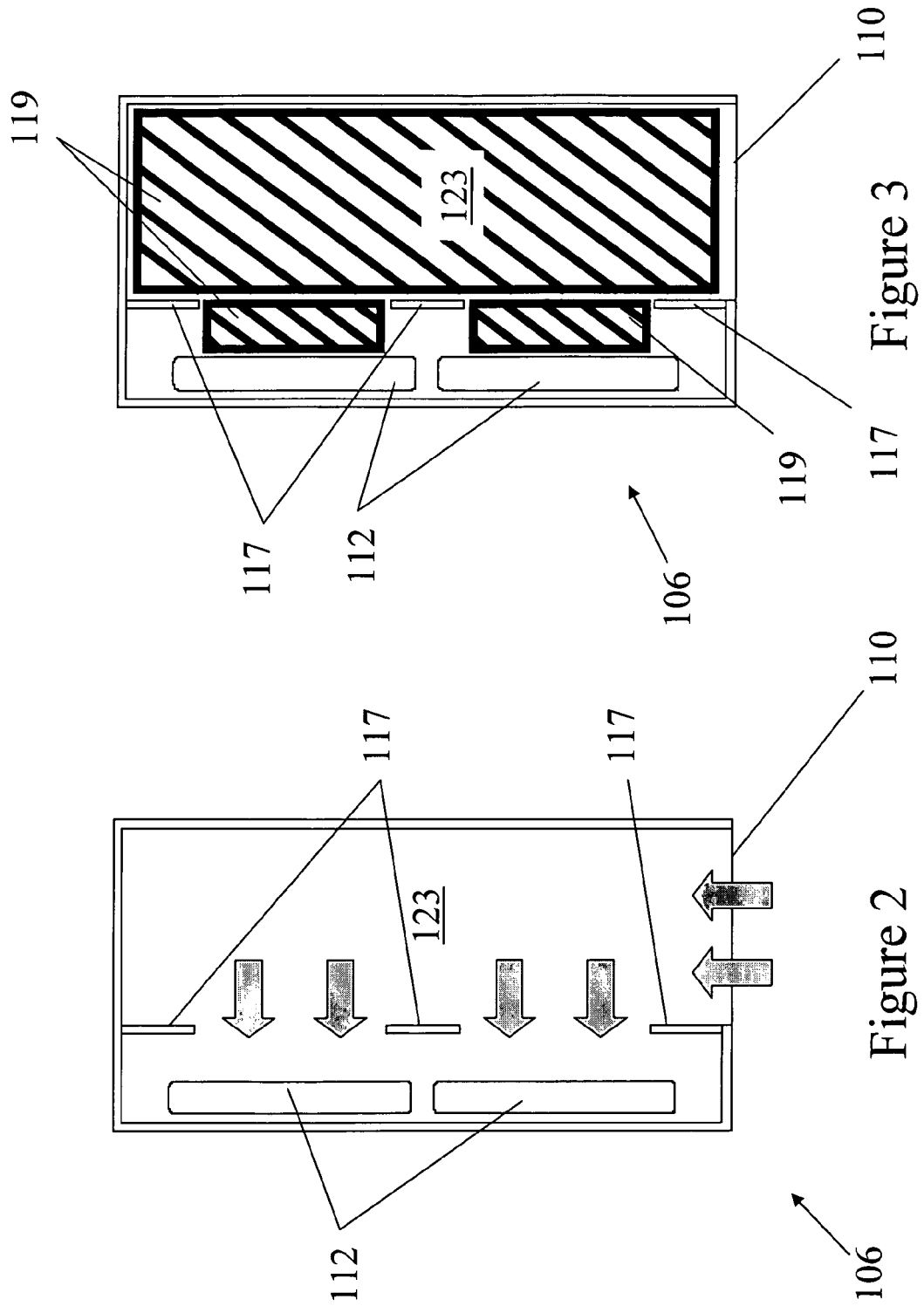

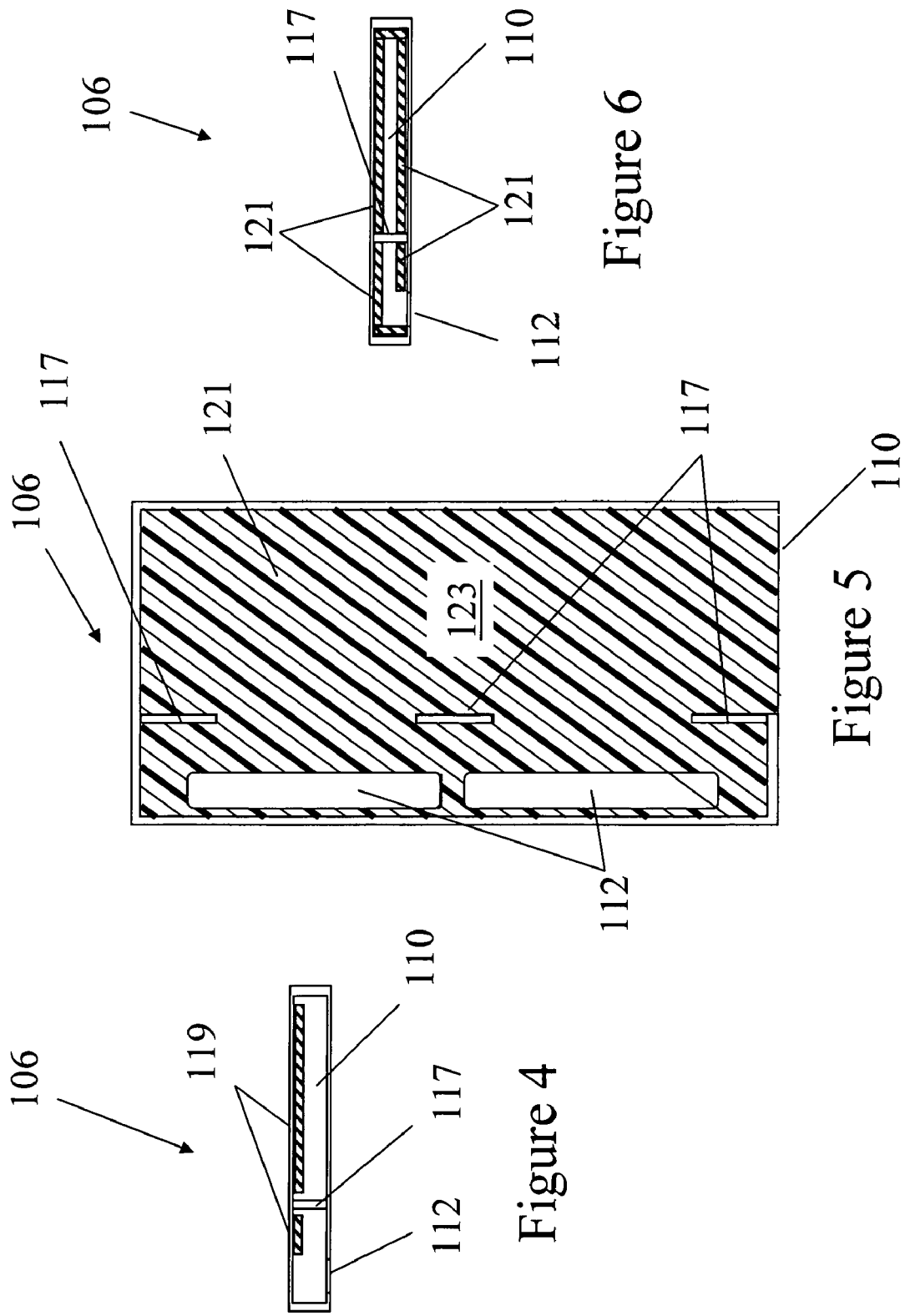

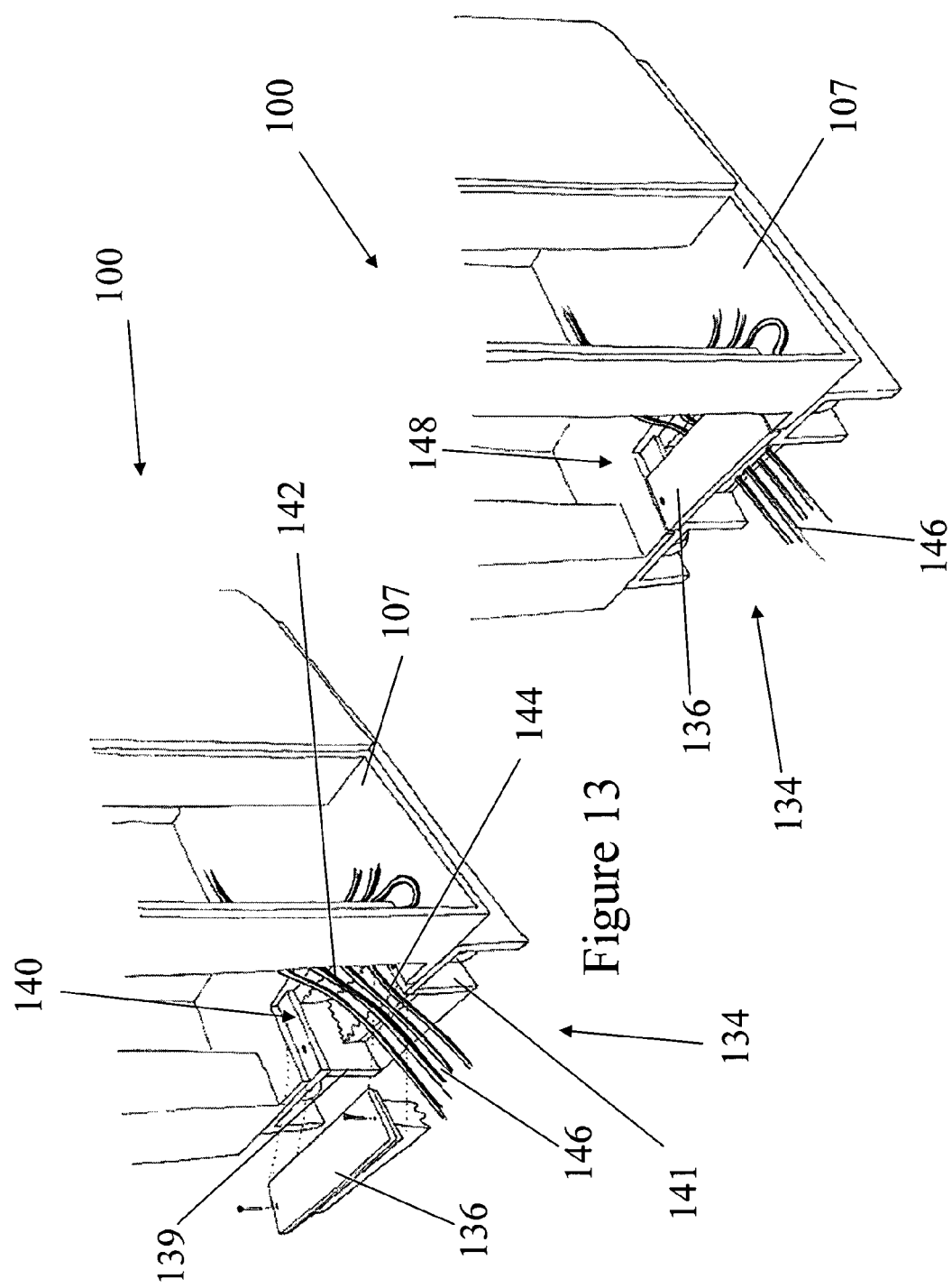

NOISEPROOFED AND VENTILATED AIR INTAKE CHAMBER FOR ELECTRONICS EQUIPMENT ENCLOSURE

CROSS-REFERENCE TO RELATED APPLICATIONS

This application is a continuation of U.S. patent application Ser. No. 11/678,252, filed on Feb. 23, 2007, entitled "Noiseproofed and Ventilated Air Intake Chamber for Electronics Equipment Enclosure", which is a continuation-in-part of U.S. patent application Ser. No. 11/489,785, filed on Jul. 20, 2006, entitled "Noiseproofed and Ventilated Enclosure for Electronics Equipment", which claimed the benefit of priority under 35 U.S. C. §119(e) from U.S. Provisional Application No. 60/783,233 filed Mar. 17, 2006, entitled "Soundproofed, Ventilated Enclosure for Electronics Equipment," all of which are incorporated herein by reference.

BACKGROUND OF THE INVENTION

1. Field of Invention

The present invention relates to enclosures for electronics equipment. More particularly, the present invention relates to enclosures for electronic equipment that have the capability to ventilate the electronic equipment contained in the enclosure and reduce noise emanating from the enclosure.

2. Description of Related Art

The amount of electronic equipment found in the office and home has increased dramatically in recent years. For example, in an office environment, the use of server computers is commonplace. Likewise, high-speed Internet access is becoming increasingly available, adding to the amount of electronic equipment in use in the office environment, e.g. T1 or T3 connectivity equipment, ADSL or cable modems, Ethernet routers, and Wi-Fi access points. It is generally desirable to concentrate such equipment in a single location. Therefore, co-locating servers, network hardware, and other equipment simplifies the care for and maintenance of this equipment.

As the speed and power of today's computer and electronic equipment has increased, so has the amount of "noise" and heat produced by such equipment. This is in part due to the physical size of the various devices becoming smaller and smaller which further complicates cooling the computer and electronic equipment. This is realized by there being less surface area available for heat exchange. This means that there must be increased airflow through the equipment casing to effect cooling. The amount of noise also is increased because the cooling equipment is more powerful, to provide greater capacity, and such cooling equipment also generates more noise.

The noise from the fans and airflow is compounded by the concentration of equipment in a single location. Further, there have been attempts to decrease noise by placing equipment in sealed enclosures. However, this attempt to trap noise also trapped heat in the sealed enclosure that was generated by the equipment. The inability to remove the trapped heat has induced equipment failure. To combat this, modern enclosures have been vented in an attempt to provide adequate airflow to the equipment. Venting the enclosure allows much of the noise created by computers and electronic equipment to escape the enclosure.

A perceived solution to the noise problem was to provide a dedicated electronic equipment room, e.g., a dedicated server room. These rooms are very often sealed and provided with a separate air conditioning system to remove the heat created by the equipment and maintain a temperature for safe operation of the equipment. Depending on the amount of equipment and size of the room, they can also include noise abatement measures. However, there are a number of drawbacks to this solution. Providing a dedicated electronic equipment room is expensive and often requires valuable office space to be sacrificed. In addition, although noise levels can be reduced outside the dedicated equipment room, the noise level in the dedicated equipment room can be quite high. This can create an unpleasant, and sometime harmful, environment for those who must work on or with the electronic equipment.

Similar problems with noise were encountered in the home environment. As the amount of audio and video equipment in the home increases, so does the level of noise produced by the need to cool such equipment. For example, a common home theater system often includes one or more of the following items: a cable signal converter box, a satellite video tuner, a video cassette recorder (VCR), digital video recorder (DVR), a digital video disc (DVD) player, an audio tuner/amplifier system, and/or a media PC. Many people find this vast collection of electronic equipment unsightly.

To alleviate the problem, many home theater owners sought to hide the electronic equipment inside of enclosures or furniture. These owners encounter similar problems with heat and noise as do offices. Some home theater equipment is cooled by natural convection rather than forcing air through the equipment casing with cooling fans. When equipment is placed in an enclosure, heat is trapped, which can lead to equipment failure or a reduction of equipment life.

There is a need for a system and method that provides better noise and heat reduction for electronic equipment. The present invention overcomes the problems of the past by providing a novel system and method as set forth in the remainder of this specification referring to the attached drawings.

BRIEF SUMMARY OF THE INVENTION

The present invention is directed to systems and methods for housing electronic equipment that provides increased advantages in noise and heat reduction. An embodiment of the present invention includes an enclosure housing that has ventilation openings for the ingress and egress of cooling air. The enclosure housing may have acoustic chambers attached to it through which cooling air passes. The acoustic chambers of the embodiment are constructed of materials or are treated with materials that have noise-absorbing properties. In addition, the acoustic chambers are shaped so as to reduce the amount of noise leaving the chamber. This embodiment also uses a cable egress port to allow cables and wiring to pass into and out of the enclosure housing while blocking the transmission of noise through the egress port.

Another embodiment of the present invention includes an intake module that may be attached to the enclosure housing. This will permit air from outside the enclosure to flow into the enclosure through the intake module while reducing noise traveling in a direction opposite the airflow. The embodiment may also include an exhaust module attached to the enclosure housing that allows air to flow from the enclosure through the exhaust module to the outside of the enclosure, again while reducing noise traveling in the same direction as the air flow. The embodiment can further include a cable egress port joined to walls of the enclosure. The cable egress port allows cables and wiring to pass into the enclosure from outside the enclosure while blocking the transmission of noise through the egress port.

Yet a further embodiment of the present invention includes a ventilated housing for electronic equipment that abates noise generated by the electronic equipment disposed therein. The housing including a housing structure that is capable of being closed except for at least one air ingress opening and at least one air egress opening. The housing also includes an air intake structure further comprising an intake inlet for receiving outside air therethrough and an intake internal chamber in fluid communications with the intake inlet and an intake outlet. The intake outlet exhausts air from the intake internal chamber and passes said air into the housing structure, with the intake outlet being aligned with the housing air ingress opening. The intake internal chamber is shaped such that noise emanating from within the housing structure is substantially abated from exiting through the intake inlet. The housing also includes an air exhaust structure further comprising an exhaust inlet having at least a portion that extends into the housing structure, with the exhaust inlet for receiving air passing from within the housing structure, and with the exhaust inlet further having a portion disposed at a first angle to a horizontal plane extending through the housing structure and aligned with the housing air egress opening. The air exhaust structure also includes an exhaust internal chamber in fluid communications with the exhaust inlet and an exhaust outlet; the exhaust outlet exhausts air from the exhaust internal chamber and passes air outside the air exhaust structure. The exhaust internal chamber has at least one funnel-shaped baffle arrangement disposed and positioned within the exhaust internal chamber, the baffle arrangement including at least two non-overlapping exhaust baffles, each exhaust baffle being separately connected to the exhaust internal chamber and respectively being disposed at a second and third angle to the horizontal plane extending through the housing structure, with the exhaust baffles having lower and upper ends. The separate lower ends are distal to the exhaust inlet and spaced a first predetermined distance apart. The separate upper ends are proximal to the exhaust inlet and spaced apart a second predetermined distance that is greater than the first predetermined distance. The exhaust baffles are disposed such that noise emanating from within the housing structure is abated from exiting through the exhaust outlet. The housing further includes noise-abating material disposed on at least a portion of at least one of the funnel-shaped baffle arrangement, walls of the intake internal chamber, walls of the exhaust internal chamber, or internal walls of the housing structure for abating noise emanating from the housing structure. The housing also includes a device associated with the air intake, air exhaust, or housing structures for moving air between the outside of the housing structure and the inside of the housing structure through the air ingress opening.

The present invention will now be described in greater detail in the remainder of the specification referring to the attached drawings.

These and other aspects of the present invention will be described in detail in the remainder of the specification, claims, and attached drawings.

BRIEF DESCRIPTION OF THE SEVERAL VIEWS OF THE INVENTION

FIG. 2 shows an internal side view of an intake module constructed according to an embodiment of the present invention illustrating airflow through the module.

FIG. 3 shows an internal side view of an intake module constructed according to an embodiment of the present invention illustrating an internal anti-resonant material coating.

FIG. 4 shows an internal top view of an intake module constructed according to an embodiment of the present invention illustrating an internal anti-resonant material coating.

FIG. 5 shows an internal side view of an intake module constructed according to an embodiment of the present invention illustrating an internal foam coating.

FIG. 6 shows an internal top view of an intake module constructed according to an embodiment of the present invention illustrating an internal foam coating.

FIG. 13 shows a perspective cut-away view of an enclosure illustrating a cable egress port assembly in accordance with an embodiment of the present invention.

FIG. 14 shows the cable egress port assembly of FIG. 13 with a top cover secured in its place, illustrating a sealed egress port assembly.

DETAILED DESCRIPTION OF THE INVENTION

The present invention is directed to systems and methods for enclosing electronic equipment in a ventilated, noise reducing enclosure. The enclosure of the present invention provides for ingressing air into an enclosure and egressing air from the enclosure through at least acoustic chambers associated with the enclosure. The acoustic chambers may be constructed of materials or be treated with materials that have noise-absorbing properties. In addition, the acoustic chambers are shaped to prevent noise that entered the acoustic chamber from leaving. It is within the scope of the present invention that embodiments of the present invention can use a cable egress port that allows cables and wiring to pass through the egress port while blocking the transmission of noise through the egress port.

Figure 1:
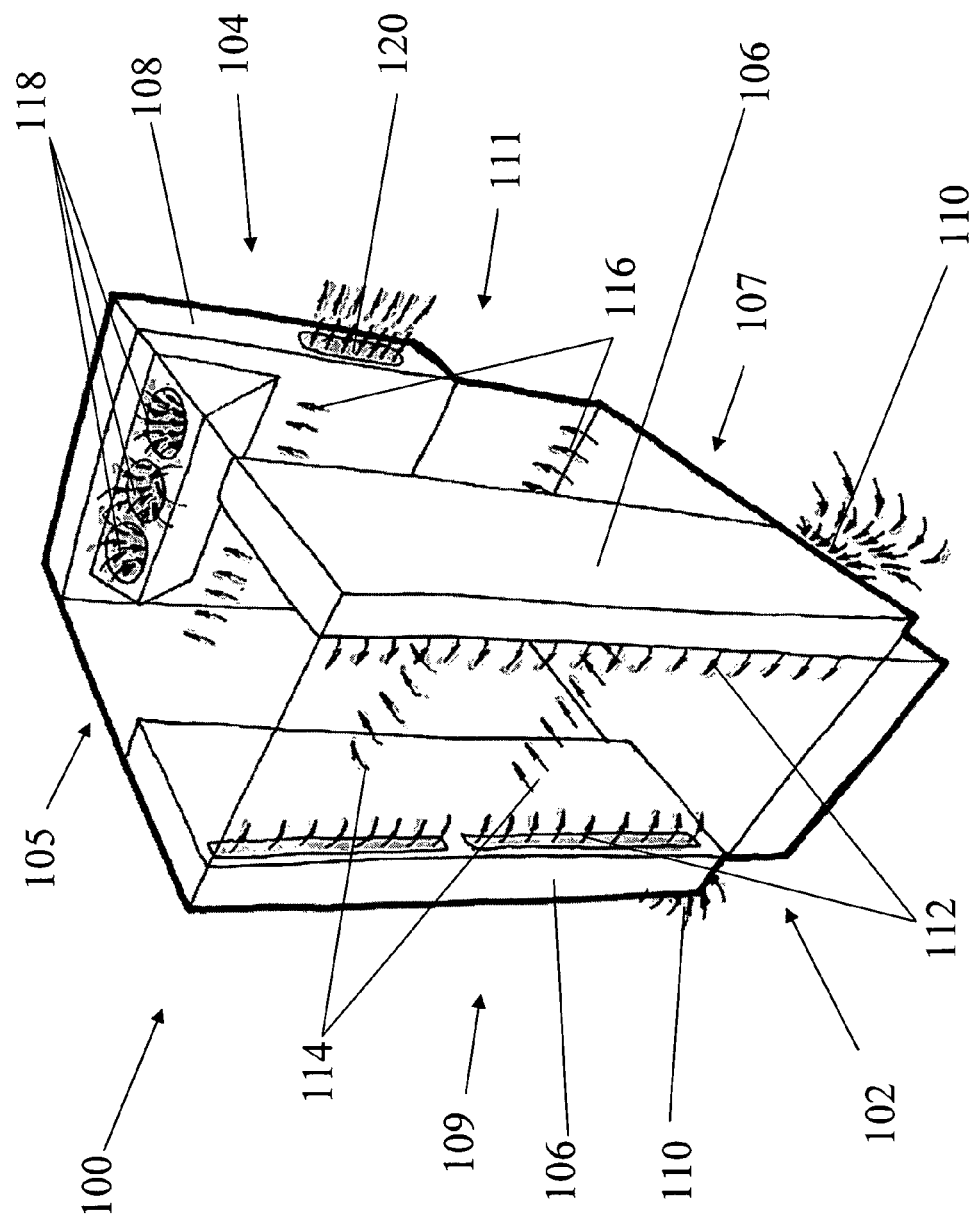
FIG. 1 shows a perspective view of an enclosure having features in accordance with an embodiment of the present invention.

FIG. 1, generally at 100, shows an embodiment of the present invention. Enclosure 100 is generally boxed-shaped, having six sides, including a front side 102, a rear side 104, a roof 105, a floor 107, a left side 109, and a right side 111. Enclosure 100 can be an equipment rack with dimensions sized to comply with the Electronic Industries Alliance 19" rack specifications (e.g., EIA™-310-D). For purposes of illustration, portions of enclosure 100 are shown as transparent in order to aid understanding. However, it is understood that enclosure 100 can be constructed of various materials, for example, wood, metal, or medium density fiberboard covered with a wood, plastic, or metal laminate. In the embodiment, portions of the inside walls of enclosure 100 may be coated with materials that have noise-absorbing or noise-abating properties. Examples of materials useful for this purpose include anti-resonant polymeric damping materials (for absorbing vibration) and/or polyurethane foam (such as that sold commercially as PYROSORB Flame Resistant Acoustic Foam). Preferably, the polyurethane foam can be either flat foam (e.g., foam of 10 mm or 25 mm uniform thickness) or "egg box" foam. Examples of anti-resonant polymeric damping materials include TS3 1.8 mm thick chlorinated polyethylene (CPE) flexible polymeric damping sheet used in the automotive industry. The damping sheet may have adhesive backing to increase the ease of application. Other examples include one or a combination of polymer foams, fiberglass, carpet, and other anti-resonance sheet materials. Coating portions of the inside walls of enclosure 100 with anti-resonant materials helps to reduce the amount of noise transmitted to the walls of enclosure 100, thereby reducing the amount of noise passed to the outside of enclosure 100 by the walls.

Electronic equipment (not shown) can be disposed in enclosure 100 and can rest on floor 107 or can reside on shelves (not shown in FIG. 1) located in enclosure 100. Enclosure 100 has acoustic chambers in the form of two air intake modules 106 positioned adjacent to front side 102 and an exhaust module 108 positioned near the top of rear side 104. Intake modules 106 and exhaust module 108 may be connected to enclosure 100 in such a manner that preferably air will enter enclosure 100 near front side 102 and exit near rear side 104 when cooling fans are in operation. Intake modules 106 and exhaust module 108 may be connected to enclosure 100 by friction grip connectors that allow for removal and replacement of intake modules 106 and exhaust module 108 without the use of tools, or the modules may be fixedly joined to enclosure 100.

In FIG. 1, the sets of small arrows generally illustrate the direction of airflow through enclosure 100. According to the embodiment shown, air is drawn into bottom intake inlets 110 of intake modules 106. This air then passes through the interior of intake modules 106 and enters enclosure 100 through vertical intake outlets 112. The air passes generally front to back, as shown by arrows 114, and passes through and/or around electronic equipment located in the central portion of enclosure 100, thereby cooling to the equipment. The air shown at 112 and 114 travels to and up rear side 104, as shown by arrows 116, toward exhaust inlets 118 in exhaust module 108. After passing through the interior of exhaust module 108, the air exits exhaust module 108 through exhaust outlets 120. Although only one exhaust outlet is shown in FIG. 1, a plurality of exhaust outlets may be available, such as the one located on the opposite side of exhaust module 108.

FIG. 2 shows a side view of left intake module 106 of FIG. 1 with a right-side wall 123 shown as transparent, illustrating airflow through the interior of intake module 106. As in FIG. 1, arrows generally illustrate airflow through inlet module 106. As explained above, air enters intake module 106 through intake inlet 110. Although a single intake inlet 110 is shown on the bottom of intake module, intake inlet 110 can be located elsewhere on intake module 106. In addition, more than one inlet can be provided, e.g., another intake inlet can be provided on the top of intake module 106 (not shown).

The airflow exits intake module 106 through vertical intake outlets 112. Intake outlets 112 are positioned to convey the air to front side 102 of enclosure 100. Intake outlets 112 are shown as rectangular openings having a generally vertical orientation. Intake outlets 112 can include other shapes, e.g., a series of round openings positioned adjacent front side 102 of enclosure 100. In this embodiment, the combined aperture size of intake outlets 112 is greater than or equal to the aperture size of the intake inlet 110.

In this embodiment, intake module 106 has internal supports 117 that span the gap between the sidewalls of intake module 106. Internal supports 117 provide increased rigidity to the sidewalls of intake module 106. These supports can be constructed of the same material used for the construction of enclosure 100. However, intake module 106 may be constructed of a material that provides sufficient structural rigidity such that internal supports 117 are not necessary.

The interior surface of the walls of intake module 106 are coated with one or a combination of polymer foams, polyurethane egg box foam, fiberglass, self-adhesive rubber sheeting, carpet, and anti-resonance sheet materials, as described above. FIG. 3 shows the side view of intake module 106 of FIG. 2, illustrating an anti-resonant coating 119 on the interior surface of the walls of intake module 106. In this embodiment, the preferred anti-resonant coating 119 is TS3 1.8 mm thick (CPE) flexible polymeric damping sheet, as described above. However, it is intended that other materials that suppress low frequency noise generated by the electronics inside enclosure 100 and prevents the noise from passing through the structure of intake module 106 may be used for anti-resonant coating 119.

FIG. 4 shows a top view of intake module 106 of FIG. 2, illustrating the anti-resonant coating 119. The relative thickness of anti-resonant coating 119 is exaggerated for the purpose of illustration. FIG. 4 also shows intake outlets 112 and intake inlet 110.

FIGS. 3 and 4 show anti-resonant coating 119 covering a portion of the inside wall of intake module 106. However, it is also contemplated that anti-resonant coating 119 can cover other portions of the walls of intake module 106, as well as the entire inside surface of the walls and still obtain a desired noise abatement effect.

FIG. 5 shows the side view of intake module 106 of FIG. 2, illustrating a foam coating 121 on the interior surface of the walls of intake module 106. Foam coating 121 is placed over the top of anti-resonant coating 119. In this embodiment, foam coating 121 is the egg box-style PYROSORB Flame Resistant Acoustic Foam, described above. This foam coating 121 absorbs high frequency noise generated by the electronics inside enclosure 100 and prevents the noise from passing in the reverse direction of the airflow through intake module 106. Although not shown, the sidewall in the panel of the page is covered with a foam coating as well.

FIG. 6 shows a top view of intake module 106 of FIG. 2, illustrating foam coating 121. For the purposed of illustration, anti-resonant coating 119 is omitted from the illustration and the relative thickness of foam coating 121 is exaggerated. FIG. 4 also shows intake outlets 112 and intake inlet 110.

FIGS. 5 and 6 show foam coating 121 covering the entire surface of the inside walls of intake module 106. However, it is also contemplated that foam coating 121 can cover only a portion of the walls of intake module 106 and still obtain a desired noise abatement effect.

In addition to having anti-resonant and noise absorbing materials coating the interior surface of the walls of intake module 106, intake module 106 is shaped to reduce the amount of noise that escapes intake module 106. FIG. 6 illustrates that noise entering intake module 106 is focused onto foam coating 121 and reflects onto other foam-coated portions of the interior surface of the walls of intake module 106. Because the interior surfaces of intake module 106 are treated with noise-absorbing material, the noise loses energy with each reflection. If the noise eventually exits through intake inlet 110, its energy, and therefore its volume, is greatly reduced. In this way, various embodiments of the present invention provide for the free-flow of air into enclosure 100 while reducing noise from escaping enclosure 100. In addition, although not required, intake inlet 110 is downward facing. This orientation of intake inlet 110 causes the noise to reflect off of the ground, and in some instances, reflect back into intake module 106 through intake inlet 110, further reducing the amount of noise escaping enclosure 100.

Figure 7:
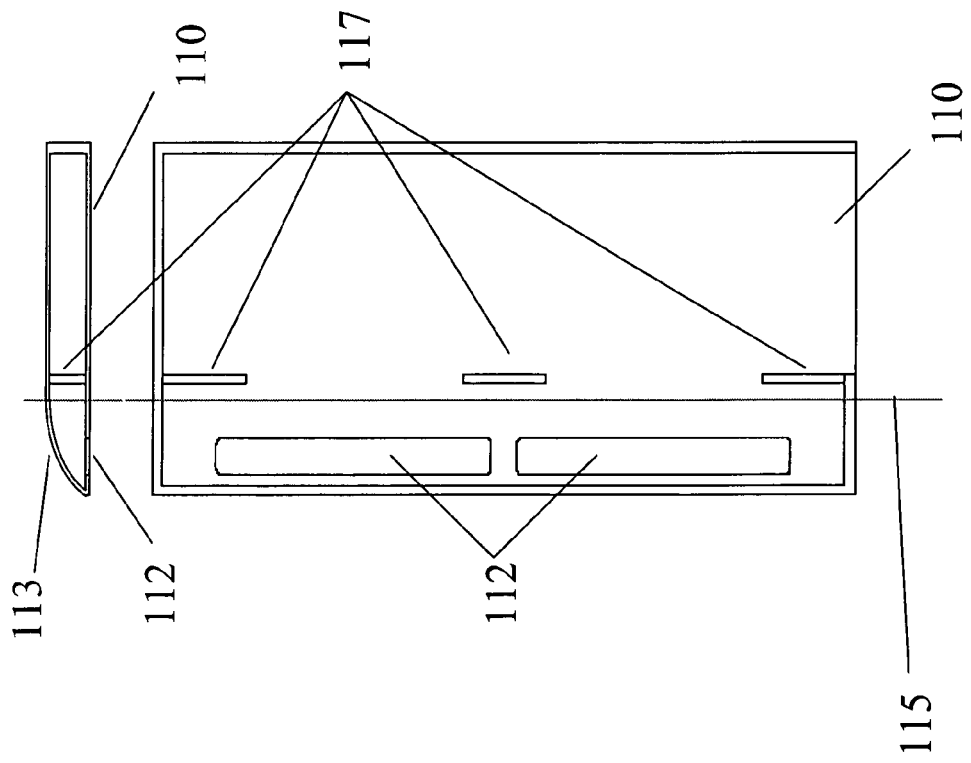
FIG. 7 shows both an internal side view and an internal top view of an intake module constructed according to an embodiment of the present invention illustrating a curved sidewall portion.

FIG. 7 illustrates an embodiment having an intake module 106 with a curved sidewall portion 113. Internal supports 117 act as a fulcrum to enable the straight sidewall portion to be bent along a curve line 115 and provide rigidity to the sidewall portion. However, as shown in FIGS. 4 and 6, the sidewalls of intake module 106 can also be straight.

Figure 8:
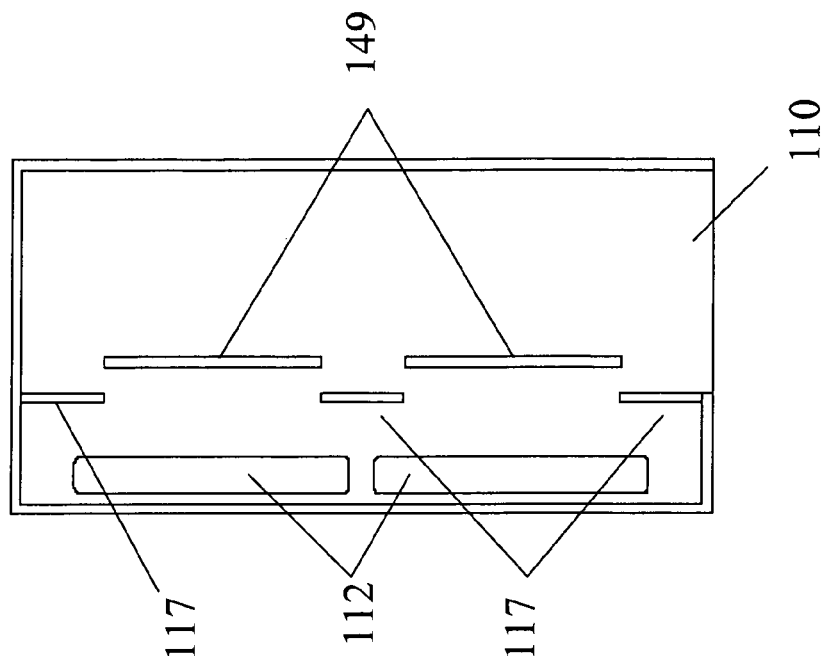
FIG. 8 shows an internal side view of an intake module constructed according to an embodiment of the present invention illustrating optional internal baffles.

As shown in FIG. 8, intake module 106 of another embodiment includes optional internal baffles 149. Internal baffles 149 can be positioned as shown in FIG. 8, or they can be placed in other arrangements. Internal baffles 149 can be coated with one or more of the noise absorbing or abating materials above and can reduce the amount of noise that escapes from intake module 106.

Figure 9:
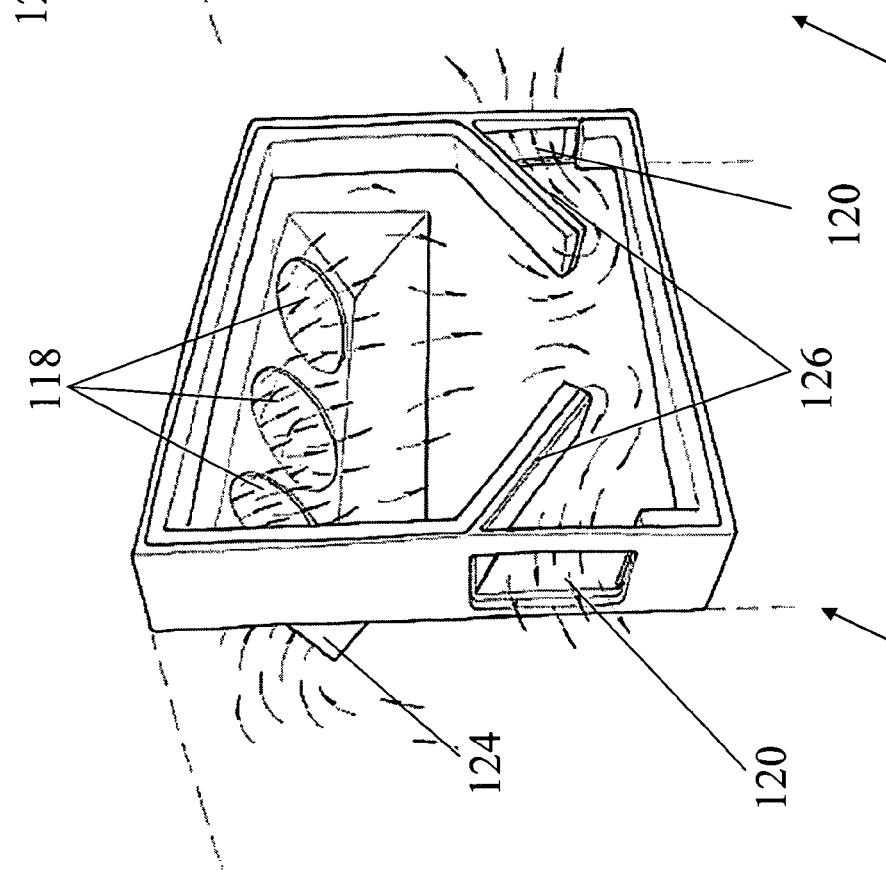
FIG. 9 shows a cut-away perspective view of an exhaust module constructed according to an embodiment of the present invention illustrating airflow through the module.

FIG. 9 shows a cut-away perspective view of exhaust module 108 of the embodiment, illustrating airflow through the interior of exhaust module 108. Small arrows generally illustrate airflow through exhaust module 108. Air from adjacent enclosure 100 enters exhaust module 108 through exhaust inlets 118. After the air enters exhaust module 108, the air passes between and then beneath internal baffles 126 and exits through exhaust outlets 120. Three exhaust inlets 118 are shown in FIG. 9, however, it is understood that more or less than three inlets may be used and still be within the scope of the present invention. Although not shown in FIG. 9, fans can be mounted in exhaust inlets 118 to draw air from enclosure 100 into exhaust module 108.

Figures 11, 12:
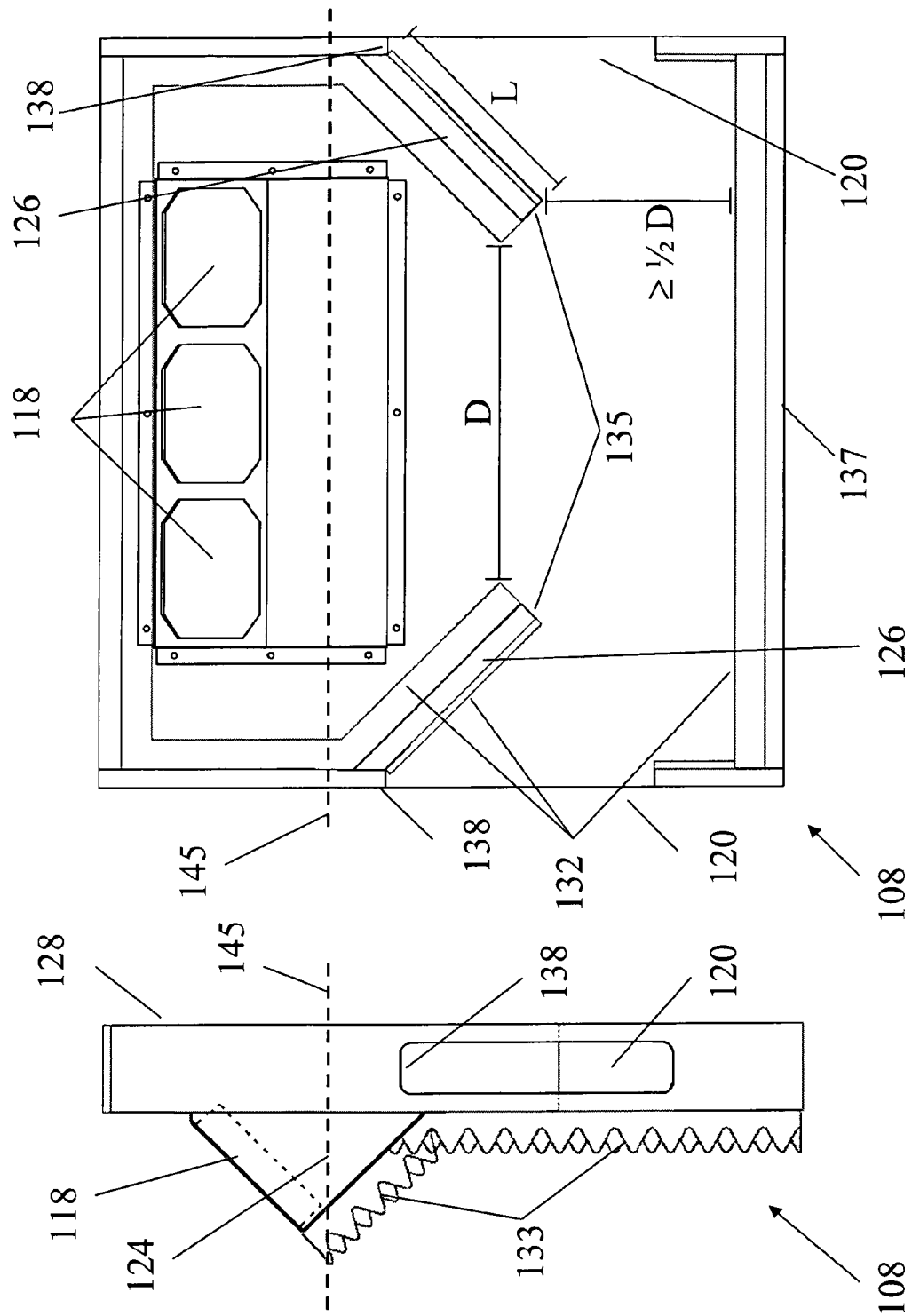
FIG. 11 shows a side view of an exhaust module constructed according to an embodiment of the present invention.
FIG. 12 shows a cut-away rear view of an exhaust module constructed according to an embodiment of the present invention.

Exhaust module 108 can have an angled fan mount 124, which is angled relative to a horizontal plane 145 extending through enclosure 100. Angled fan mount 124 forms a small channel that directs the air entering exhaust module 108 generally toward internal baffles 126. Angled fan mount 124 reduces the backpressure exerted on fans mounted in exhaust inlets 118 and increases the airflow through exhaust module 108 as compared to an exhaust module without angled fan mount 124. This aspect increases heat removal from enclosure 100. The selection of the angle of angled fan mount 124 relative to a rear wall 128 (as best shown in FIG. 11) is a compromise between increasing the airflow through enclosure 100 and reducing space occupied by angled fan mount 124 in enclosure 100. Angles of 30°-60° can be used successfully. The angle in the example embodiment is 45° relative to rear wall 128 of exhaust module 108.

Figure 10:
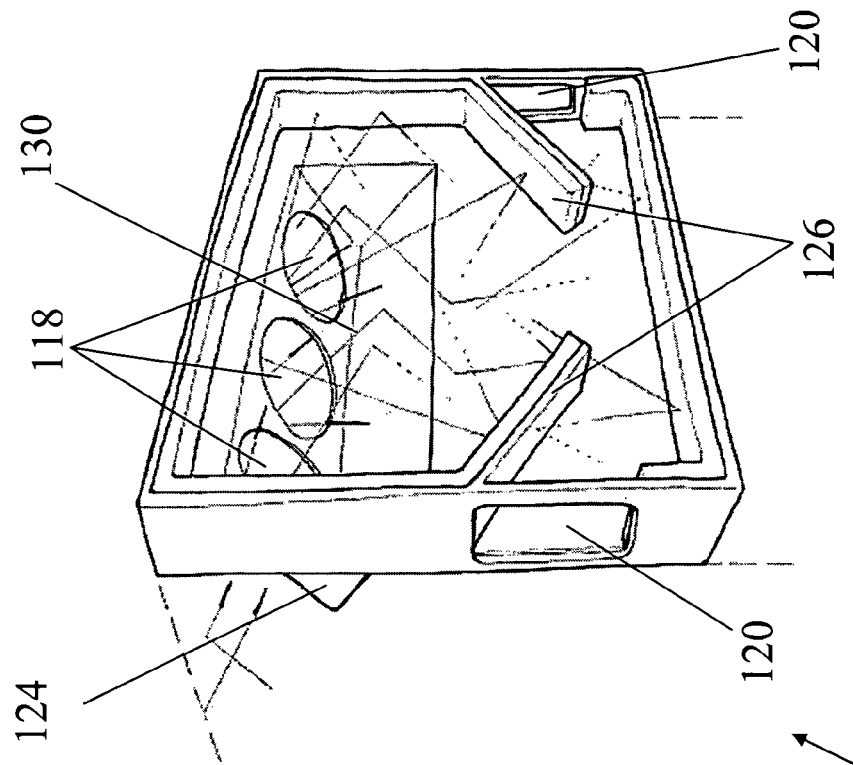
FIG. 10 shows a cut-away perspective view of an exhaust module constructed according to an embodiment of the present invention illustrating noise reflection within the module.

FIG. 10 shows the cut-away perspective view of exhaust module 108 of FIG. 9, illustrating noise reflections within exhaust module 108. Multi-segmented arrows generally illustrate example noise paths emanating from enclosure 100 and show noise reflections off the interior walls and internal baffles 126 of exhaust module 108. The angle of fan mount 124 aids in creating noise reflections by directing noise entering exhaust module 108 from enclosure 100 into rear wall 128 of exhaust module 108 (as best shown by FIG. 11). In addition, angled fan mount 124 holds fans mounted in exhaust inlets 118 spaced away from rear wall 128. This spacing reduces the noise energy transmitted to rear wall 128, resulting in reduced noise transmission by rear wall 128 outside of enclosure 100. Internal baffles 126 are disposed within exhaust module 108 to drastically reduce noise passing from exhaust inlets 118 to exhaust outlets 120. In this embodiment, internal baffles 126 are positioned so that there is not a line of sight between exhaust inlets 118 and exhaust outlets 120.

An example noise path 130 shows noise entering exhaust module 108 through exhaust inlet 118 and reflecting off of rear wall 128. The noise further reflects off of the interior surface of an opposite wall of exhaust module 108 and then reflects off of internal baffle 126. In this example, because the interior surface of exhaust module 108 and the surface of internal baffles 126 are treated with noise-absorbing or noise-abating material (as described in detail below), the noise loses energy with each reflection. If the noise eventually exits through exhaust outlets 120, its energy, and therefore its volume, is greatly reduced. In this way, embodiments of the present invention provide for the free-flow of air out of enclosure 100 while drastically reducing noise from escaping enclosure 100. The arrangement of internal baffles 126 is not limited to only what is shown in FIGS. 7 and 8. It is contemplated that additional baffles may be provided between exhaust inlets 118 and internal baffles 126 and/or between internal baffles 126 and exhaust outlets 120, and still be within the scope of the present invention.

FIG. 12 shows a cut-away rear view of exhaust module 108. As illustrated in FIG. 12, internal baffles 126 and the walls of exhaust module 108 can be constructed of or treated with materials similar to those used for the walls of intake modules 106 to render the walls and internal baffles 126 noise-absorbing. Noise-absorbing material 132 can cover internal baffles 126 as well as any other interior wall surface of exhaust module 108. Although not shown in FIG. 12, the walls of exhaust module 108 that lie in the plane of the page can also be covered with noise-absorbing material. Similarly, as shown in FIG. 11, surfaces 133 of the exhaust module that are exposed to the inside of enclosure 100 can be covered with noise-absorbing material. Covering these surfaces with noise-absorbing material increases the amount of noise energy absorbed inside of enclosure 100.

FIG. 12 also illustrates certain design aspects of internal baffles 126 of the example embodiment. Internal baffles 126 are angled such that the surface of internal baffles 126 are generally normal to exhaust inlets 118 when viewed in the 2-dimensional view presented in FIG. 12, thereby forming a funnel-shaped baffle arrangement. In the example embodiment, internal baffles 126 are at an angle of 45° relative to the horizontal. Other angles may be used, depending upon the position of the exhaust inlets 118. In addition, a length L of internal baffles 126 is selected to block a line of sight from right exhaust outlet 120 to the far left-hand edge of exhaust inlets 118 (the same being true with regard to the left exhaust outlet 120 and far right-hand edge of exhaust inlets 118). These aspects increase the likelihood of reflecting noise energy away from exhaust outlets 120.

Furthermore, ends 135 of internal baffles 126 are spaced apart by a distance D. Thus, in the example embodiment, internal baffles 126 are non-overlapping. Ends 135 are also spaced apart from a bottom wall 137 by a distance of at least one-half D. Thus, the total aperture formed by the two spaces between ends 135 of internal baffles 126 and bottom wall 137 is equal to or greater than the aperture formed by the space between ends 135 of internal baffles 126. Likewise, the total aperture formed by the two exhaust outlets 120 is equal to or greater than the aperture formed by the space between ends 135 of internal baffles 126. These aspects increase the airflow through exhaust module 108, thereby increasing the heat removal from enclosure 100.

FIG. 12 also illustrates that in the example embodiment, upper edges 138 of exhaust outlets 120 meet the base of internal baffles 126. This aspect of the embodiment prevents heat rising along the lower surface of internal baffles 126 from becoming trapped inside exhaust module 126.

FIG. 13 shows a perspective partial cut-away view of enclosure 100 illustrating a cable egress port 134 in accordance with the embodiment. To illustrate the structure of egress port 134, a top cover 136 is removed and spaced apart from the opening of egress port 134. Egress port 134 can be joined to floor 107 of enclosure 100 by various methods such that egress port 134 is removable or solidly attached. For example, egress port 134 can be joined to floor 107 of enclosure 100 by nuts and bolts, screws, or other fasteners, or, egress port 134 can be joined to floor 107 by welding, soldering, or gluing. One advantage of a detachable egress port 134 is that it can be removed before relocating enclosure 100, thereby avoiding possible damage to egress port 134 because of its proximity to the ground.

Egress port 134 has four sides: a left upright side 139, right upright side 141, a front upright side 142, and a bottom side 144. The sides are arranged so that when attached to floor 107 of enclosure 100, the three upright sides surround a hole in floor 107. The four sides of egress port 134 form a rear-upward facing opening 140. With top cover 136 removed, cables 146 can be placed into opening 140 of egress port 134 without the need to thread cables 146 through opening 140. This advantageously allows for placement of cables 146 having large end connectors without the need to first remove the connectors and replace the connectors once cables 146 are in position. Likewise, cables 146 can be easy removed from opening 140 of egress port 134 without having to modify end connectors present on cables 146.

The four sides of egress port 134 can be constructed of materials similar to those used for the walls of enclosure 100 described above. Likewise, the inside surfaces of the sides of egress port 134 can be treated or covered with materials that have noise-absorbing properties similar to those mentioned above. In the example embodiment, the inside surfaces of the sides of egress port 134 are coated with the TS3 1.8 mm thick flexible polymeric damping sheet described above to absorb vibration. Ten and/or 25 mm thick polyurethane foam is placed on top of the polymeric damping sheet covering the left and right upright sides. Egg box style polyurethane foam is placed on top of the polymeric damping sheet covering front upright side 142 and a portion of bottom side 144. Egg box style polyurethane foam is also placed on the underside of top cover 136 such that when top cover 136 is secured in its place, the polyurethane foam layers on top cover 136 and bottom side 144 are pressed together to form a noise-absorbing seal around cables 146. Small vertical slits can be made in the polyurethane foam on the top cover 136 to facilitate sealing around cables 146.

FIG. 14 shows cable egress port 134 of FIG. 13 with top cover 136 secured in its place, illustrating a sealed egress port assembly. A cable passage 148 remains open to enclosure 100 to allow cables 146 to enter enclosure 100. However, any noise entering cable passage 148 is prevented from exiting egress port 134 because of the arrangement of noise proofing materials described above.

The terms and expressions that are employed herein are terms of description and not of limitation. There is no intention in the use of such terms and expressions of excluding the equivalents of the feature shown or described, or portions thereof, it being recognized that various modifications are possible within the scope of the invention as claimed.

What is claimed is:

1. A housing for abating noise generated from within the housing, the housing comprising:

a housing structure defined at least in part by a front upright side, a rear upright side, a left upright side, and a right upright side, the housing structure adapted to house electronic equipment therein;

an intake internal chamber defined by a plurality of chamber walls, each wall of the plurality having an internal surface and an external surface;

an intake inlet in fluid communication with the intake internal chamber for receiving air from outside the housing structure therethrough;

an intake outlet for exhausting air from the intake internal chamber into the housing structure, wherein the intake outlet includes at least one or more openings, each of the at least one or more openings extending vertically along and adjacent to a vertical edge of the front upright side, each of the at least one or more openings being disposed to deliver air to a space adjacent to the front upright side the one or more openings collectively and extending along substantially the entire vertical edge of the front upright side;

the housing structure having an air ingress opening in fluid communication with the intake outlet of the intake internal chamber, and the housing structure having an air egress opening for passing air outside the housing structure; and noise-abating material disposed on at least a portion of the internal surface of at least one wall defining the intake internal chamber.

2. The housing of claim 1, further comprising at least one support structure within the intake internal chamber for supporting the walls of the intake internal chamber.

3. The housing of claim 1, wherein the noise-abating material is at least one of a polymer foam, a polyurethane foam, an anti-resonant polymeric damping sheet, fiberglass, carpet, a rubber sheet, or a chlorinated polyethylene flexible sheet material.

4. The housing of claim 1, wherein a first cross sectional area of the intake outlet is equal to or greater than a second cross sectional area of the intake inlet.

5. The housing of claim 1, further comprising:

a second intake internal chamber defined by a second plurality of chamber walls, each wall of the second plurality having an internal surface and an external surface;

a second intake inlet in fluid communication with the second intake internal chamber for receiving outside air therethrough;

a second intake outlet for exhausting air from the second intake internal chamber and passing said air into the housing structure;

the housing structure having a second air ingress opening in fluid communication with the second intake outlet of the second intake internal chamber; and noise-abating material disposed on at least a portion of the internal surface of at least one wall defining the second intake internal chamber.

6. The housing of claim 1, further comprising an air exhaust structure, the air exhaust structure including:

an exhaust inlet having at least a portion that extends into the housing structure, with the exhaust inlet for receiving air passing from within the housing structure, and with the exhaust inlet further having a portion disposed at a first angle to a horizontal plane extending through the housing structure and aligned with the housing structure air egress opening;

an exhaust internal chamber in fluid communications with the exhaust inlet and an exhaust outlet;

the exhaust outlet for exhausting air from the exhaust internal chamber and passing air outside the air exhaust structure;

at least one funnel-shaped baffle arrangement disposed and positioned within the exhaust internal chamber, the baffle arrangement including at least two non-overlapping exhaust baffles, each exhaust baffle being separately connected to the exhaust internal chamber and respectively being disposed at a second and third angle to the horizontal plane extending through the housing structure, with the exhaust baffles having lower and upper ends, the separate lower ends being distal to the exhaust inlet and spaced a first predetermined distance apart, the separate upper ends being proximal to the exhaust inlet and spaced apart a second predetermined distance that is greater than the first predetermined distance, the exhaust baffles being disposed such that noise emanating from within the housing structure is abated from exiting through the exhaust outlet; and noise-abating material disposed on at least a portion of at least one of the funnel-shaped baffle arrangement, internal walls of the exhaust internal chamber walls, or internal walls of the housing structure for abating noise emanating from within the housing structure.

7. The housing of claim 6, wherein at least one of the exhaust baffles is disposed so that other than a direct line of sight exists between the exhaust inlet and the exhaust outlet.

8. The housing of claim 6, further comprising a device associated with the intake internal chamber, air exhaust structure, or housing structure for moving air between the outside of the housing structure and the inside of the housing structure through the air ingress opening.

9. The housing of claim 6, wherein a first cross sectional area of the exhaust outlet is equal to or greater than a second cross sectional area of the exhaust inlet.

10. The housing of claim 9, wherein a third cross sectional area of an aperture formed by the exhaust baffles and the internal walls of the exhaust internal chamber is equal to or greater than the second cross sectional area of the exhaust inlet.

11. The housing of claim 6, wherein the air exhaust structure is removably joined to the housing structure.

12. The housing of claim 6, wherein the air exhaust structure is integrally formed with the housing structure.

13. The housing of claim 6, further comprising more than one air exhaust structure associated with the housing structure.

14. The housing of claim 6, wherein the first angle is between about 30 degrees and about 60 degrees.

15. The housing of claim 14, wherein the first angle is about 45 degrees.

16. The housing of claim 6, wherein the second angle is between about 30 degrees and about 60 degrees.

17. The housing of claim 16, wherein the second angle is about 45 degrees.

18. The housing of claim 1, wherein the intake internal chamber lacks a device for moving air between the outside of the housing structure and the inside of the housing structure through the air ingress opening.

* * * * *

UNITED STATES PATENT AND TRADEMARK OFFICE
CERTIFICATE OF CORRECTION

PATENT NO. : 7,782,612 B2  Page 1 of 1
APPLICATION NO. : 12/041152
DATED : August 24, 2010
INVENTOR(S) : Tim Walsh et al.

It is certified that error appears in the above-identified patent and that said Letters Patent is hereby corrected as shown below:

Col. 9, line 66, claim 1, should read:
  1.  A housing for abating noise generated from within the housing, the housing comprising:
    a housing structure defined at least in part by a front upright side, a rear upright side, a left upright side, and a right upright side, the housing structure adapted to house electronic equipment therein;
    an intake internal chamber defined by a plurality of chamber walls, each wall of the plurality having an internal surface and an external surface;
    an intake inlet in fluid communication with the intake internal chamber for receiving air from outside the housing structure therethrough;
    an intake outlet for exhausting air from the intake internal chamber into the housing structure, wherein the intake outlet includes at least one or more openings, each of the at least one or more openings extending vertically along and adjacent to a vertical edge of the front upright side, each of the at least one or more openings being disposed to deliver air to a space adjacent to the front upright side <u>and</u> the one or more openings [[and]] collectively extending along substantially the entire vertical edge of the front upright side;
    the housing structure having an air ingress opening in fluid communication with the intake outlet of the intake internal chamber, and the housing structure having an air egress opening for passing air outside the housing structure; and
    noise-abating material disposed on at least a portion of the internal surface of at least one wall defining the intake internal chamber.

Signed and Sealed this

Thirtieth Day of November, 2010

David J. Kappos
*Director of the United States Patent and Trademark Office*